United States Patent
Ishiguro et al.

(10) Patent No.: US 10,118,256 B2
(45) Date of Patent: Nov. 6, 2018

(54) SHEET METAL PROCESSING METHOD USING LASER BEAMS AND DIRECT DIODE LASER PROCESSING DEVICE FOR CARRYING IT OUT

(71) Applicant: AMADA HOLDINGS CO., LTD., Kanagawa (JP)

(72) Inventors: Hiroaki Ishiguro, Kanagawa (JP); Akihiko Sugiyama, Kanagawa (JP); Hiroshi Sako, Kanagawa (JP)

(73) Assignee: AMADA HOLDINGS CO., LTD., Kanagawa (JP)

( * ) Notice: Subject to any disclaimer, the term of this patent is extended or adjusted under 35 U.S.C. 154(b) by 0 days.

(21) Appl. No.: 15/514,079

(22) PCT Filed: Sep. 17, 2015

(86) PCT No.: PCT/JP2015/076459
§ 371 (c)(1),
(2) Date: Mar. 24, 2017

(87) PCT Pub. No.: WO2016/059938
PCT Pub. Date: Apr. 21, 2016

(65) Prior Publication Data
US 2017/0291262 A1 Oct. 12, 2017

(30) Foreign Application Priority Data
Oct. 15, 2014 (JP) .................. 2014-211001

(51) Int. Cl.
*B23K 26/38* (2014.01)
*B23K 26/142* (2014.01)
(Continued)

(52) U.S. Cl.
CPC .......... *B23K 26/38* (2013.01); *B23K 26/0608* (2013.01); *B23K 26/0648* (2013.01);
(Continued)

(58) Field of Classification Search
CPC .. B23K 26/00; B23K 26/064; B23K 26/0665; B23K 26/142; B23K 26/38;
(Continued)

(56) References Cited

U.S. PATENT DOCUMENTS

| 4,681,396 | A | * | 7/1987 | Jones | ...................... | B23K 26/06 |
| | | | | | | 219/121.6 |
| 4,945,207 | A | * | 7/1990 | Arai | ....................... | B23K 26/14 |
| | | | | | | 219/121.64 |

(Continued)

FOREIGN PATENT DOCUMENTS

| JP | 2001-259880 | 9/2001 |
| JP | 2004-114090 | 4/2004 |

(Continued)

OTHER PUBLICATIONS

Machine translation of Japan Patent document No. 2008-044,000, Dec. 2017.*

(Continued)

*Primary Examiner* — Geoffrey S Evans
(74) *Attorney, Agent, or Firm* — Greenblum & Bernstein, P.L.C.

(57) ABSTRACT

Using a transmission fiber for transmitting laser beams of multiple wavelengths oscillated by a DDL module, and a laser processing machine for cutting a sheet metal with a processing head that condenses the laser beams of multiple wavelengths and irradiates them onto the sheet metal, a mild steel plate or an aluminum plate is cut, and by cutting a mild steel plate with a thickness greater than or equal to 1 mm and less than or equal to 5 mm, a surface roughness (Ra) of a cut surface of the cut mild steel plate is less than or equal to 0.4 μm, and when an aluminum plate with a thickness greater than or equal to 1 mm and less than or equal to 5 mm is cut, (Continued)

a surface roughness (Ra) of a cut surface of the cut aluminum plate is less than or equal to 2.5 µm.

9 Claims, 5 Drawing Sheets

(51) Int. Cl.
| | |
|---|---|
| *B23K 26/06* | (2014.01) |
| *B23K 37/02* | (2006.01) |
| *B23K 26/08* | (2014.01) |
| *B23K 26/14* | (2014.01) |
| *B23K 26/40* | (2014.01) |
| *H01S 5/022* | (2006.01) |
| *H01S 5/40* | (2006.01) |
| *B23K 103/04* | (2006.01) |
| *H01S 5/00* | (2006.01) |
| *B23K 101/18* | (2006.01) |
| *B23K 103/10* | (2006.01) |

(52) U.S. Cl.
CPC ...... *B23K 26/0665* (2013.01); *B23K 26/0876* (2013.01); *B23K 26/14* (2013.01); *B23K 26/142* (2015.10); *B23K 26/40* (2013.01); *B23K 37/0235* (2013.01); *H01S 5/02284* (2013.01); *H01S 5/4012* (2013.01); *B23K 2201/18* (2013.01); *B23K 2203/04* (2013.01); *B23K 2203/05* (2015.10); *B23K 2203/10* (2013.01); *H01S 5/005* (2013.01); *H01S 5/4087* (2013.01)

(58) Field of Classification Search
CPC ............ B23K 26/0648; H01S 5/02284; H01S 5/4102; H01S 5/4087
See application file for complete search history.

(56) References Cited

U.S. PATENT DOCUMENTS

| | | | | |
|---|---|---|---|---|
| 2007/0119833 A1* | 5/2007 | Briand | ................... | B23K 26/06 219/121.72 |
| 2011/0248005 A1 | 10/2011 | Briand et al. | | |
| 2012/0154922 A1* | 6/2012 | Briand | ................ | B23K 26/046 359/641 |
| 2013/0146569 A1* | 6/2013 | Woods | ................... | B23K 26/06 219/121.64 |
| 2013/0148925 A1* | 6/2013 | Muendel | ................... | G02B 6/32 385/27 |
| 2014/0096376 A1 | 4/2014 | Riva et al. | | |
| 2015/0048069 A1* | 2/2015 | Debecker | ............... | B23K 26/38 219/121.75 |
| 2015/0102016 A1* | 4/2015 | Bruck | .................. | B23K 35/327 219/73.2 |
| 2015/0321286 A1* | 11/2015 | Heinemann | ........ | B23K 26/0608 219/121.76 |
| 2015/0375337 A1* | 12/2015 | Hayashi | ................. | B23K 26/38 219/121.61 |
| 2016/0008920 A1* | 1/2016 | Goya | .................... | B23K 26/38 219/121.61 |

FOREIGN PATENT DOCUMENTS

| | | | |
|---|---|---|---|
| JP | 2008-044000 A | * | 2/2008 |
| JP | 2008-290135 | | 12/2008 |
| JP | 2012-501855 | | 1/2012 |
| WO | WO-2013/068665 A1 | * | 5/2013 |

OTHER PUBLICATIONS

Lentjes et al., "Metal Cutting with Multi kW Diode Laser", Dec. 2012, Verlag GMBH, www.laser-journal.de, pp. 31-33.*
Rodrigues et al., "Laser Cutting with direct diode laser", May 2013, Elsevier, Physics Procedia 41, pp. 558-565.*
Wahab et al., "Optimization of Laser Cutting Quality with Design of Experiments", May 2014, Wiley-VCH, Laser Technik Journal, pp. 27-31.*
Previtali et al., "Performance and efficiency of an industrial direct diode source with an extremely low BPP in laser cutting of Fe-based and reflective alloys", Jun. 2015, Lasers in Manufacturing Conference 2015.*
Search Report issued in International Patent Application No. PCT/JP2015/076459, dated Dec. 1, 2015.
Notification of Reasons for Refusal, dated Nov. 18, 2015, with English language translation.
Memorandum of Decision to Grant a Patent, dated Mar. 9, 2016, with English language translation.
Decision to Grant a Patent, dated Mar. 9, 2016, with English language translation.
Notification of Grounds for Revocation dated Dec. 6, 2017 with partial English translation relevant to documents 3 and 5.
"Laser cutting with direct diode laser" Rodrigues et al. Physics Procedia 41 (May 2013) pp. 558-565.
"High Output Laser Process Technology" (Jun. 2004) pp. 128-135.
"Fibre laser cutting of thin section mild steel: An explanation of the 'striation free' effect" Powell et al. Optics and Lasers in Engineering 49 (Apr. 2011) pp. 1069-1075.
"High Output Laser Process Technology" (Jun. 2004) pp. 130-141.

* cited by examiner

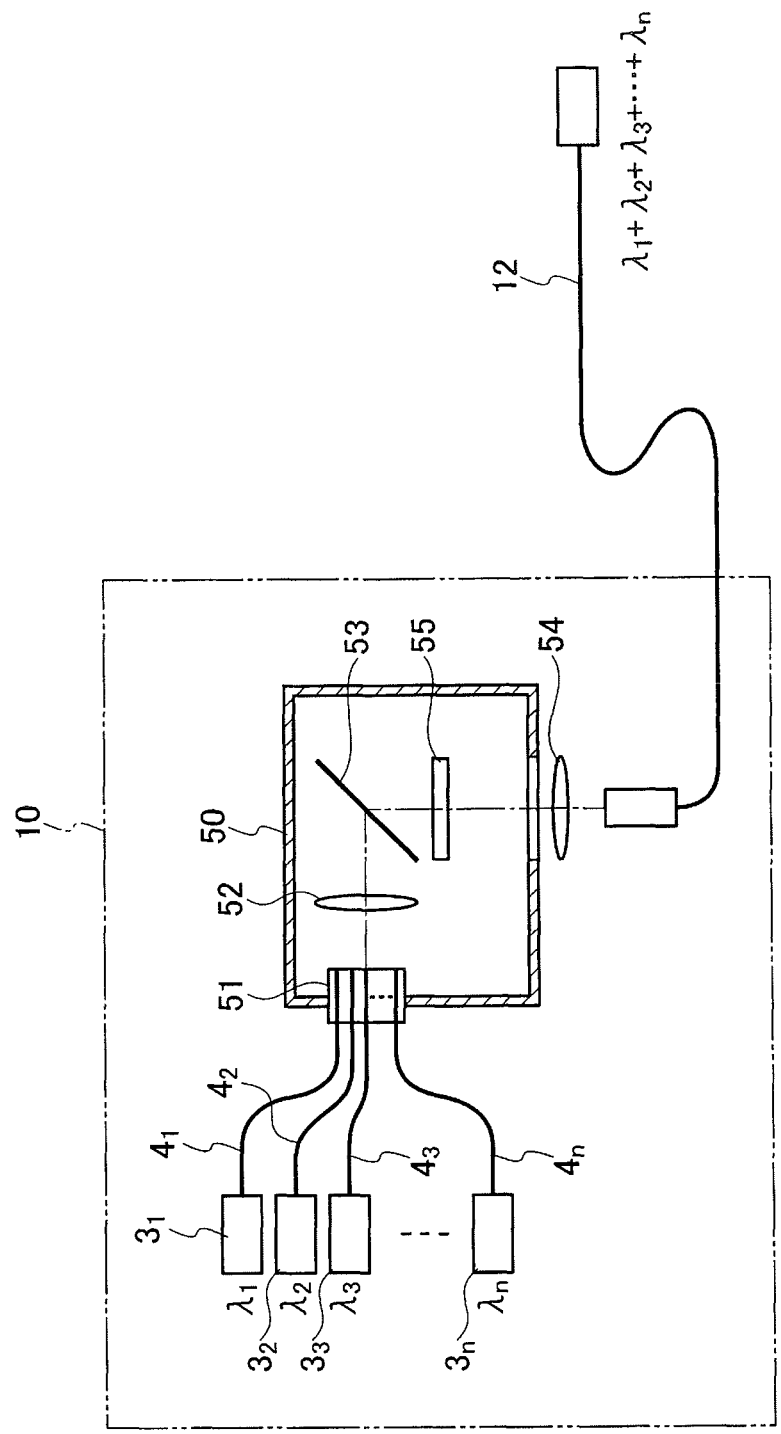

SHEET METAL PROCESSING METHOD USING LASER BEAMS AND DIRECT DIODE LASER PROCESSING DEVICE FOR CARRYING IT OUT

TECHNICAL FIELD

The present invention relates to a sheet metal processing method using laser beams and a direct diode laser processing device for carrying it out.

BACKGROUND ART

Conventionally, as a laser processing device for a sheet metal processing, those using a carbon dioxide ($CO_2$) laser oscillator, a YAG laser oscillator, or a fiber laser oscillator as a laser light source are known. The fiber laser oscillator is superior in the optical quality than the YAG laser oscillator, and has an advantage of extremely high oscillation efficiency and the like. For this reason, the fiber laser processing device using the fiber laser oscillator has been utilized for an industrial use, in particular for a sheet metal processing (a cutting or a welding and the like).

Moreover, in recent years, a laser processing machine using a direct diode laser (DDL) module as a laser light source has been developed. The DDL module superposes laser beams of multiple wavelengths generated by a plurality of laser diodes (LD), and transmits them to a processing head by using a transmission fiber. Then, the laser beams ejected from an end face of the transmission fiber are condensed and irradiated onto a material to be processed (a workpiece) by a collimator lens and a condensing lens and the like.

By the way, in the laser processing, a processing method in which a surface roughness of a cut surface becomes uniform has been pursued (Patent Document 1).

However, in Patent Document 1, no quantitative discussion was made so that a guarantee of uniformity was not sufficient.

Also, there was no discussion regarding laser beams from which laser generation source among laser beams from the above noted various generation sources are optimal for guaranteeing a uniformity.

PRIOR ART DOCUMENTS

Patent Documents

Patent Document 1: Japanese Patent Application Publication No: 2001-259880

SUMMARY OF THE INVENTION

The present invention has been made in view of the above noted problems, and its object is to provide a sheet metal processing method and a direct diode laser processing device for carrying it out, which guarantee a uniformity of a cut surface quantitatively.

According to an aspect of the present invention, there is provided a sheet metal processing method, comprising: oscillating laser beams of multiple wavelengths from a DDL module; transmitting the oscillated laser beams of multiple wavelengths; and processing by cutting a sheet metal with a processing head that condenses the transmitted laser beams of multiple wavelengths and irradiates them onto the sheet metal that is a mild steel plate with a thickness greater than or equal to 1 mm and less than or equal to 5 mm; wherein a surface roughness (Ra) of a cut surface of the cut mild steel plate is less than or equal to 0.4 μm.

Preferably, an assist gas is oxygen, and its pressure is 0.05 (MPa) to 0.2 (MPa).

Preferably, a focal length of a condensing lens mounted on said processing head is 150 (mm) to 250 (mm).

Preferably, in a case where a BPP is 10.3 (mm*mrad), a power of the laser beams from said processing head is 1600 (W) to 2000 (W), a power density is $8.9 \times 10^5$ (W/cm$^2$) to $2.8 \times 10^6$ (W/cm$^2$), a beam waist diameter is 300 (μm) to 480 (μm), and a Rayleigh length is 2.2 (mm) to 5.6 (mm).

Preferably, a nozzle diameter of a nozzle for ejecting an assist gas is 0.8 (mm) to 4 (mm), and a nozzle height is 0.5 (mm) to 1.5 (mm).

According to another aspect of the present invention, there is provided a sheet metal processing method, comprising: oscillating laser beams of multiple wavelengths from a DDL module; transmitting the oscillated laser beams of multiple wavelengths; and processing by cutting a sheet metal with a processing head that condenses the transmitted laser beams of multiple wavelengths and irradiates them onto the sheet metal that is an aluminum plate with a thickness greater than or equal to 1 mm and less than or equal to 5 mm; wherein a surface roughness (Ra) of a cut surface of the cut aluminum plate is less than or equal to 2.5 μm.

Preferably, an assist gas is nitrogen, and its pressure is greater than or equal to 0.8 (MPa).

Preferably, a focal length of a condensing lens mounted on said processing head is 120 (mm) to 190 (mm).

Preferably, in a case where a BPP is 10.3 (mm*mrad), a power of the laser beams from said processing head is 1600 (W) to 2000 (W), a power density is $1.5 \times 10^6$ (W/cm$^2$) to $4.8 \times 10^6$ (W/cm$^2$), a beam waist diameter is 230 (μm) to 364 (μm), and a Rayleigh length is 1.3 (mm) to 3.4 (mm).

Preferably, a nozzle diameter of a nozzle for ejecting an assist gas is 1.5 (mm) to 4 (mm), and a nozzle height is 0.3 (mm) to 1.0 (mm).

According to still another aspect of the present invention, there is provided a direct diode laser processing device, comprising: a DDL module for oscillating laser beams of multiple wavelengths; a transmission fiber for transmitting the laser beams of multiple wavelengths oscillated by said DDL module; and a laser processing machine for processing by cutting a sheet metal with a processing head that condenses the laser beams of multiple wavelengths transmitted by said transmission fiber and irradiates them onto the sheet metal, wherein when a mild steel plate with a thickness greater than or equal to 1 mm and less than or equal to 5 mm is cut, a surface roughness (Ra) of a cut surface of the cut mild steel plate is less than or equal to 0.4 μm.

Preferably, an assist gas is oxygen, and its pressure is 0.05 (MPa) to 0.2 (MPa).

Preferably, a focal length of a condensing lens mounted on said processing head is 150 (mm) to 250 (mm).

Preferably, in a case where a BPP is 10.3 (mm*mrad), a power of the laser beams from said processing head is 1600 (W) to 2000 (W), a power density is $8.9 \times 10^5$ (W/cm$^2$) to $2.8 \times 10^6$ (W/cm$^2$), a beam waist diameter is 300 (μm) to 480 (μm), and a Rayleigh length is 2.2 (mm) to 5.6 (mm).

Preferably, a nozzle diameter of a nozzle for ejecting an assist gas is 0.8 (mm) to 4 (mm), and a nozzle height is 0.5 (mm) to 1.5 (mm).

According to still another aspect of the present invention, there is provided a direct diode laser processing device, comprising: a DDL module for oscillating laser beams of multiple wavelengths a transmission fiber for transmitting the laser beams of multiple wavelengths oscillated by said DDL module; and a laser processing machine for processing by cutting a sheet metal with a processing head that condenses the laser beams of multiple wavelengths transmitted by said transmission fiber and irradiates them onto the sheet metal, wherein when an aluminum plate with a thickness greater than or equal to 1 mm and less than or equal to 5 mm is cut, a surface roughness (Ra) of a cut surface of the cut aluminum plate is less than or equal to 2.5 μm.

Preferably, an assist gas is nitrogen, and its pressure is greater than or equal to 0.8 (MPa).

Preferably, a focal length of a condensing lens mounted on said processing head is 120 (mm) to 190 (mm).

Preferably, in a case where a BPP is 10.3 (mm*mrad), a power of the laser beams from said processing head is 1600 (W) to 2000 (W), a power density is $1.5 \times 10^6$ (W/cm$^2$) to $4.8 \times 10^6$ (W/cm$^2$), a beam waist diameter is 230 (μm) to 364 (μm), and a Rayleigh length is 1.3 (mm) to 3.4 (mm).

Preferably, a nozzle diameter of a nozzle for ejecting an assist gas is 1.5 (mm) to 4 (mm), and a nozzle height is 0.3 (mm) to 1.0 (mm).

According to the present invention, it is possible to cut a mild steel plate or an aluminum plate with a quantitatively guaranteed surface roughness (Ra).

BRIEF DESCRIPTION OF THE DRAWINGS

FIG. 2(*b*) is a front view of said laser oscillator.

FIG. 3 is a schematic view showing one example of an LD module according to an embodiment of the present invention.

DETAILED DESCRIPTION OF THE INVENTION

Figure 1:
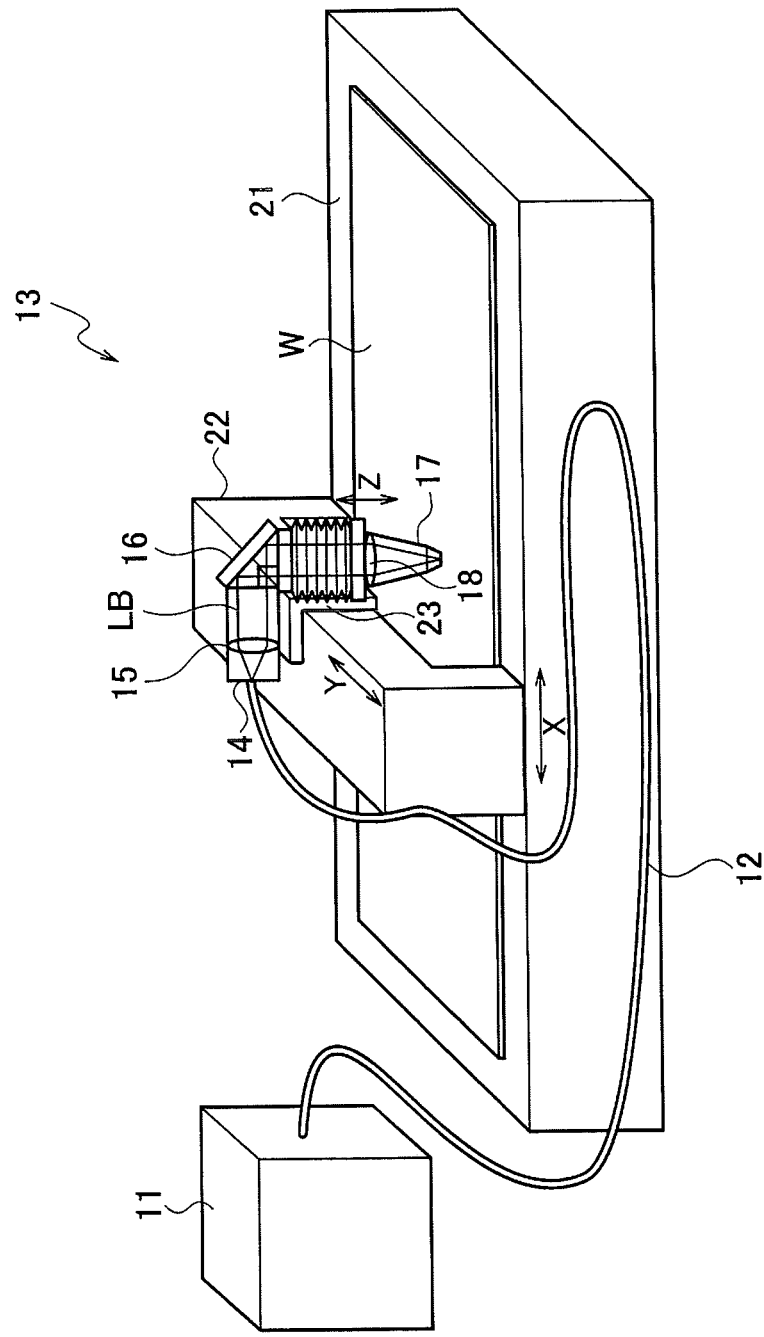
FIG. 1 is a perspective view showing one example of a laser processing machine according to an embodiment of the present invention.

The embodiments of the present invention will be described with references to the drawings. In the following description of the drawings, identical or similar portions will be given identical or similar reference numerals.

FIG. 1 shows an overall configuration of a DDL, laser processing machine according to an embodiment of the present invention. As shown in the same figure, the DDL laser processing machine according to said embodiment is equipped with a laser oscillator 11 for oscillating laser beams LB of multiple wavelengths, a transmission fiber (process fiber) 12 for transmitting the laser beams LB oscillated by the laser oscillator 11, and a laser processing machine (laser processing machine main body portion) 13 for condensing the laser beams LB transmitted by the transmission fiber 12 to a high energy density and irradiating them onto a material to be processed (workpiece) W.

The laser processing machine 13 has a processing head 17 for irradiating the laser beams ejected from the transmission fiber 12, onto the workpiece. This processing head 17 has a collimator unit 14 for converting the laser beams from said fiber 12 into approximately parallel beams by a collimator lens 15, a bend mirror 16 for reflecting the laser beams LB converted into the approximately parallel beams, to downward in a Z-axis direction that is perpendicular to X-axis and Y-axis directions, and a condensing lens 18 for condensing the laser beams LB reflected to downward by the bend mirror 16. For the collimator lens 15 and the condensing lens 18, it is possible to use general lenses such as plano-convex lenses made of quartz, for example.

Note that, although omitted to be shown in FIG. 1, a lens driving unit for driving the collimator lens 15 in a direction (X-axis direction) parallel to an optical axis is installed inside the collimator unit 14. Also, the laser processing machine is further equipped with a control unit for controlling the lens driving unit.

The laser processing machine 13 is further equipped with a processing table 21 on which the material to be processed (workpiece) W is mounted, a gate shaped X-axis carriage 22 that moves in the X-direction on the processing table 21, and a Y-axis carriage 23 that moves in the Y-axis direction that is perpendicular to the X-axis direction, on the X-axis carriage 22. The collimator lens 15 inside the collimator unit 14, the bend mirror 16, and the condensing lens 18 inside the processing head 17 are fixed to the Y-axis carriage 23 in states of having optical axes adjusted in advance, and moved in the Y-axis direction along with the Y-axis carriage 23. Note that it is also possible to provide a Z-axis carriage that is capable of moving in a vertical direction with respect to the Y-axis carriage 23, and provide the condensing lens 18 on that Z-axis carriage.

Figure 2A:
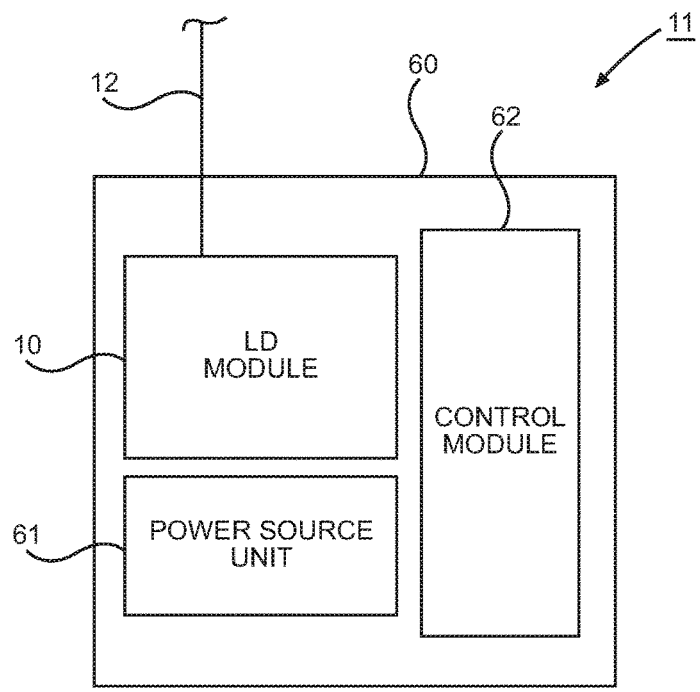
FIG. 2(*a*) is a side view showing one example of a laser oscillator according to an embodiment of the present invention.
Figure 2B:
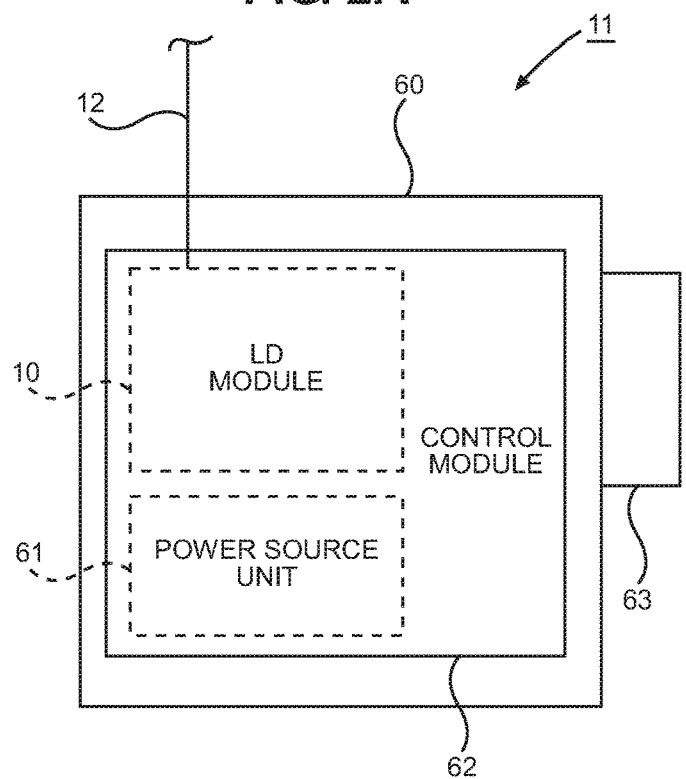

The laser processing machine according to the embodiment of the present invention irradiates the laser beams LB of a prescribed condensed diameter that are condensed by the condensing lens 18, onto the material to be processed W, and also moves them on the X-axis carriage 22 and the Y-axis carriage 23, while removing molten materials by injecting an assist gas coaxially. By this, the laser processing machine can carry out a cutting processing on the material to be processed W. For the material to be processed W, various materials such as a stainless steel, a mild steel, an aluminum can be enumerated. A plate thickness of the material to be processed W is about 0.1 mm to 100 mm, for example, FIG. 2 and FIG. 3 show details of the laser oscillator 11. As shown in FIGS. 2A and 2B, the laser oscillator 11 is provided with a casing 60, an LD module 10 housed inside the casing 60 and connected to the transmission fiber 12, a power source unit 61 housed inside the casing 60 for supplying a power to the LD module 10, and a control module 62 housed inside the casing 60 for controlling an output of the LD module 10 and the like, etc. Also, outside the casing 60, an air conditioning device 63 for adjusting a temperature and a humidity inside the casing 60 is installed.

As shown in FIG. 3, the LD module 10 outputs the laser beams of multiple wavelengths $\lambda 1, \lambda 2, \lambda 3, \ldots, \lambda n$ in superposition. The LD module 10 is equipped with a plurality of laser diodes (hereafter referred to as "LD") $3_1, 3_2, 3_3, \ldots, 3_n$ (where n is an integer greater than or equal to 4), and a spectral beam combining unit 50 connected with the LDs $3_1, 3_2, 3_3, \ldots, 3_n$ via fibers $4_1, 4_2, 4_3, \ldots, 4_n$ for carrying out a spectral beam combining with respect to the laser beams of multiple wavelengths $\lambda 1, \lambda 2, \lambda 3, \ldots, \lambda n$.

For the plurality of LDs $3_1, 3_2, 3_3, \ldots, 3_n$ it is possible to adopt various types of semiconductor lasers, where a combination of their types and numbers is not particularly limited and can be selected appropriately in accordance with the purpose of the sheet metal processing. The wavelengths $\lambda 1, \lambda 2, \lambda 3, \ldots, \lambda n$ of the LDs $3_1, 3_2, 3_3, \ldots, 3_n$ can be selected to be less than 1000 nm, or selected in a range of 800 nm to 990 nm, or selected in a range of 910 nm to 950 nm, for example, but in this embodiment, they are set to be 910 nm to 950 nm.

The laser beams of multiple wavelengths $\lambda 1, \lambda 2, \lambda 3, \ldots, \lambda n$ are controlled by being managed in groups (blocks) of respective wavelength bands. Then, the output can be variably adjusted individually for each wavelength band. Also, the output of the entire wavelength bands can be adjusted such that a desired absorption rate for the workpiece is obtained.

At a time of the cutting processing, the LDs $3_1, 3_2, 3_3, \ldots, 3_n$ are operated simultaneously, while an appropriate assist gas such as oxygen, nitrogen and the like is sprayed in vicinity of a focal position. By this, the laser beams of respective wavelengths from these respective LDs cooperate with each other, while they also cooperate with the assist gas such as oxygen and the like, to melt the workpiece at high speed. Also, the workpiece is cut at high speed as these molten work materials are blown off by the assist gas.

The spectral beam combining unit 50 is equipped with a fixing unit 51 for bundling and fixing ejecting end sides of the fibers $4_1, 4_2, 4_3, \ldots, 4_n$ to make a fiber array 4, a collimator lens 52 for converting the laser beams from the fibers $4_1, 4_2, 4_3, \ldots, 4_n$ into parallel beams, a diffraction grating 53 for diffracting the laser beams of multiple wavelengths $\lambda 1, \lambda 2, \lambda 3, \ldots, \lambda n$, and a condensing lens 54 for condensing the laser beams from the diffraction grating 53 and injecting them into the transmission fiber 12. Note that, between the diffraction grating 53 and the condensing lens 54, there is provided a partial reflection coupler 55, that constitutes a resonator together with reflection faces provided at rear end portions of the LD units $3_1, 3_2, 3_3, \ldots, 3_n$. This partial reflection coupler 55 is preferably arranged between the collimator lens 52 and the condensing lens 54.

Referring to FIG. 1 again, in the processing such as the cutting processing by such a laser processing machine 13, beam waists for respective wavelengths of the laser beams of multiple wavelengths $\lambda 1, \lambda 2, \lambda 3, \ldots, \lambda n$ are about 100 μm to 400 μm for example, and multiple focal points are formed with these plurality of diameters. The beam waist is formed by an optical element with a focal length of 50 mm to 300 mm, where an incident diameter of the condensing lens 18 is about 2 mm to 20 mm. In the output variable adjustment of the control for each wavelength or each wavelength band in the laser oscillator 11, with an axis perpendicular to a cut surface of the material to be processed W as an incident angle 0°, the output in the wavelength band on shorter wavelength side can be made larger than the output on longer wavelength side at the incident angle of 0 to 40°. The cutting speed of the material to be processed W can be selected in a range of 2 m/min to 250 m/min, for example.

(The Sheet Metal Cutting Processing Method)

In the following, using the above described laser processing machine, one embodiment of a sheet metal processing method of the present invention for cutting a mild steel plate with a plate thickness of 1 mm to about 4.5 mm and an aluminum plate with a plate thickness of 1 mm to 5 mm will be described.

1. A Method for Cutting a Mild Steel Plate with a Plate Thickness of 1 mm about 4.5 mm This method is one that cuts a mild steel plate with a thickness of greater than or equal to 1 mm and less than or equal to 4.5 mm, by using a laser processing machine having a DDL module for oscillating laser beams of multiple wavelengths, a transmission fiber for transmitting the laser beams of multiple wavelengths from said DDL module; and a processing head that condenses the laser beams of multiple wavelengths transmitted by said transmission fiber and irradiates them onto the sheet metal, and obtains a cut surface with a surface roughness (Ra) of less than or equal to 0.4 μm.

Here, the surface roughness (Ra) means an arithmetic average roughness.

Said surface roughness (Ra=0.4 μm) is much smaller compared with the case of cutting a mild steel plate of the same thickness by a $CO_2$ laser processing machine (the surface roughness in the case of cutting by the $CO_2$ laser processing machine will be Ra>1.2 μm).

In said method, it is preferable that an assist gas is oxygen, and its pressure is 0.05 (MPa) to 0.2 (MPa).

In said method, it is preferable that a focal length of a condensing lens mounted on said processing head is 150 (mm) to 250 (mm).

In said method, it is preferable that, in a case where a BPP is 10.3 (mm*mrad), for example, a power of the laser beams from said processing head is 1600 (W) to 2000 (W), a power density is $8.9 \times 10^5$ (W/cm$^2$) to $2.8 \times 10^6$ (W/cm$^2$), a beam waist diameter is 300 (μm) to 480 (μm), and a Rayleigh length is 2.2 (mm) to 5.6 (mm).

In said method, it is preferable that a nozzle diameter of a nozzle for ejecting said assist gas is 0.8 (mm) to 4 (mm), and a nozzle height is 0.5 (mm) to 1.5 (mm).

2. A Method for Cutting an Aluminum Plate with a Plate Thickness of 1 mm to about 5 mm This method is one that cuts an aluminum plate with a thickness of greater than or equal to 1 mm and less than or equal to 5 mm, by using a laser processing machine having a DDL module for oscillating laser beams of multiple wavelengths, a transmission fiber for transmitting the laser beams of multiple wavelengths from said DDL module; and a processing head that condenses the laser beams of multiple wavelengths transmitted by said transmission fiber and irradiates them onto the sheet metal, and obtains a cut surface with a surface roughness (Ra) of less than or equal to 2.5 μm.

This surface roughness (Ra=2.5 μm) is much smaller compared with the case of cutting an aluminum plate of the same thickness by a fiber laser processing machine (the surface roughness in the case of cutting by the fiber laser processing machine will be Ra>2.7 μm). Note that this is the case with a plate thickness of 2 mm, and that difference will be even larger in the case with a plate thickness of greater than 2 mm, as will be described below.

In said method, it is preferable that an assist gas is nitrogen, and its pressure is greater than or equal to 0.8 (MPa).

In said method, it is preferable that a focal length of a condensing lens mounted on said processing head is 120 (mm) to 190 (mm).

In said method, it is preferable that, in a case where a BPP is 10.3 (mm*mrad), for example, a power of the laser beams from said processing head is 1600 (W) to 2000 (W), a power density is $1.5 \times 10^6$ (W/cm$^2$) to $4.8 \times 10^6$ (W/cm$^2$), a beam waist diameter is 230 (μm) to 364 (μm), and a Rayleigh length is 1.3 (mm) to 3.4 (mm).

In said method, it is preferable that a nozzle diameter of a nozzle for ejecting an assist gas is 1.5 (mm) to 4 (mm), and a nozzle height is 0.3 (mm) to 1.0 (mm).

In the following, practical examples of said embodiment will be described.

1. An Index for the Processing Evaluation

The following practical example shows a practical example in which a mild steel plate and an aluminum plate are cut by the laser processing machine of said embodiment (the laser processing machine using the DDL module), a comparative example in which a mild steel plate and an aluminum plate are cut by the $CO_2$ laser processing machine having the $CO_2$ laser oscillator, and a comparative example in which a mild steel plate and an aluminum plate are cut by the fiber laser processing machine having the fiber laser oscillator.

Then, said sheet metals are cut by the laser beams from the DDL module according to the embodiment of this invention, the laser beams from the $CO_2$ laser oscillator, and the laser beams from the ytterbium fiber laser oscillator, and the surface roughnesses of their cut surfaces are compared.

Note that said surface roughness (Ra) means an arithmetic average roughness. This refers to "a value obtained by the following equation, expressed in micrometers (μm), when a reference length is extracted from a roughness curve in a direction of its average line, an X-axis is taken as the direction of the average line of this extracted portion, a Y-axis is taken as a direction of a longitudinal magnification, and the roughness curve is expressed by y=f(x)" (JIS B 0601 (1994), JIS B 0031 (1994)).

$$Ra = \frac{1}{\ell} \int_0^\ell |f(x)| dx \qquad [\text{Eq. 1}]$$

2. Practical Example 1 (A Mild Steel Plate Cutting Method)

Figure 4:
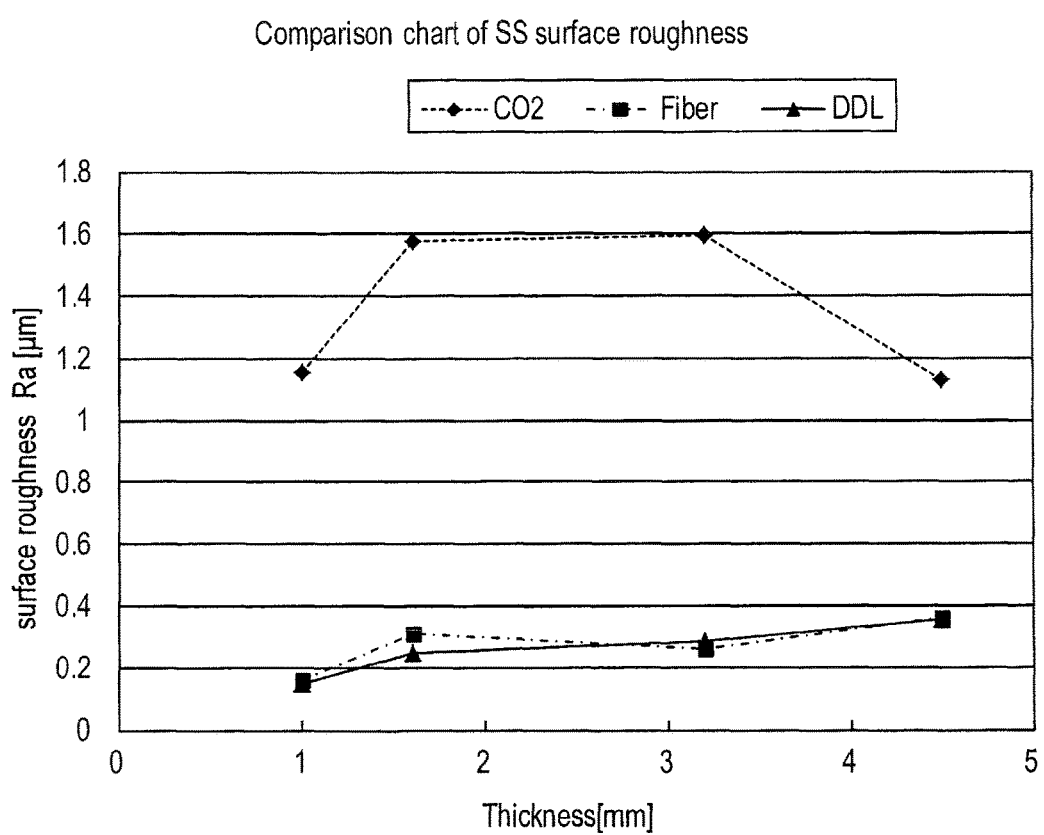
FIG. 4 is a graph showing a surface roughness of a cut surface in the case of cutting a mild steel plate with a plate thickness of 1 mm to about 4.5 mm, by a $CO_2$ laser processing machine, a fiber laser processing machine, and a DDL laser processing machine.

FIG. 4 shows test results for cutting a mild steel plate with a thickness of 1 mm to 4.5 mm, by a practical example using the laser processing machine having the DDL module of said embodiment, a comparative example 1 using the $CO_2$ laser processing machine, and a comparative example 2 using the fiber laser processing machine.

Here, values of parameters for the laser beams and the optical elements in the laser processing machine using the DDL module were as shown in the following table 1.

Note that, in FIG. 4, a horizontal axis means a thickness of a mild steel plate, and a vertical axis indicates a surface roughness of a cut surface. Also, a solid line (▲ triangle mark) indicates a surface roughness of a cut surface cut by using the laser processing machine of said embodiment, a dotted line (♦ rhomboid mark) indicates a surface roughness of a cut surface cut by using the $CO_2$ laser processing machine, and a one dot chain line (■ rectangle mark) indicates a surface roughness of a cut surface cut by using the fiber laser processing machine.

As can be seen from FIG. 4, in the case of cutting the mild steel plate with a thickness of 1 mm to 4.5 mm by the laser processing machine of said embodiment, the surface roughness of the cut surface becomes about Ra=0.2 to 0.4. In contrast to that, in the case of cutting said mild steel plate by the $CO_2$ laser processing machine, the surface roughness of the cut surface becomes as large as Ra=1.2 to 1.6.

Consequently, it is appreciated that the surface roughness of the cut surface cut by the laser processing machine of said embodiment becomes much smaller than the surface roughness of the cut surface cut by the $CO_2$ laser processing machine.

Note that the surface roughness of the cut surface cut by the laser processing machine using the fiber laser will be almost similar to the cut surface by the laser processing machine of said embodiment.

From the above, it can be seen that the surface roughness of the cut surface with which said mild steel plate is cut by the laser processing machine of the embodiment will be almost similarly large as the surface roughness of the cut surface cut by the laser processing machine using the fiber laser, but will be much smaller than the surface roughness of the cut surface cut by the $CO_2$ laser processing machine.

3. Practical Example 2 (An Aluminum Plate Cutting Processing Method)

Figure 5:
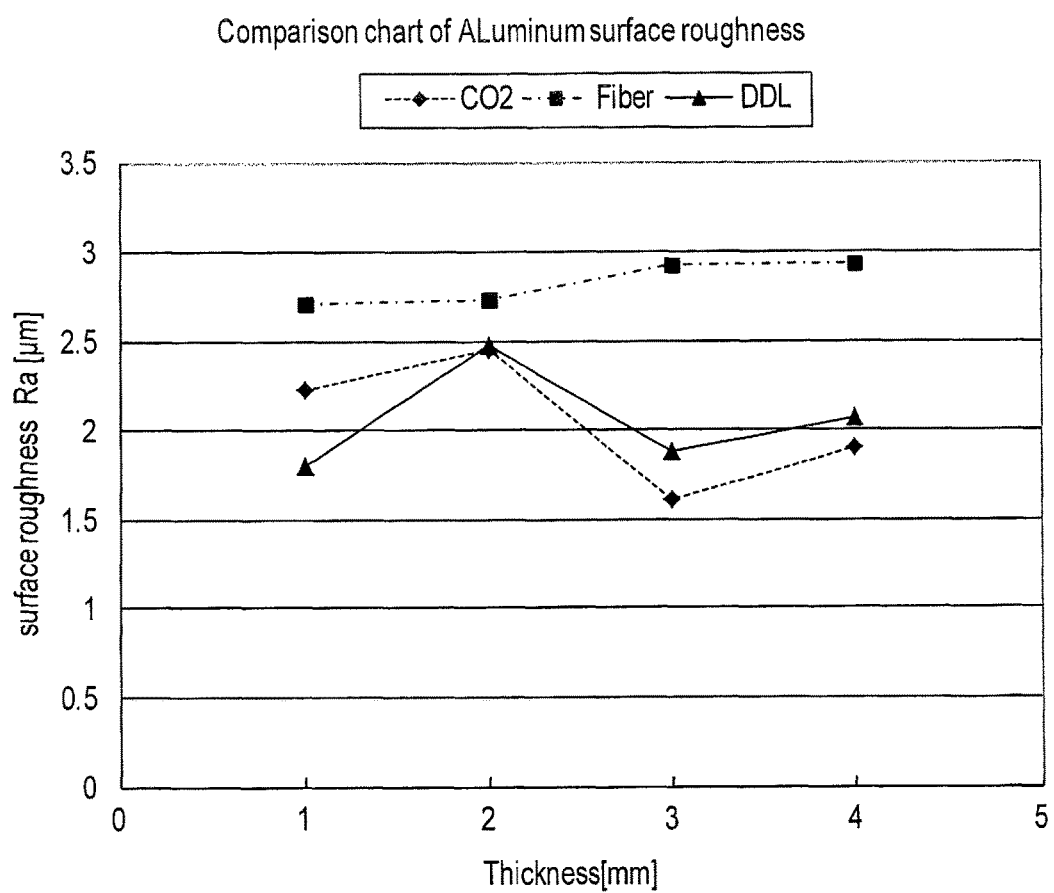
FIG. 5 is a graph showing a surface roughness of a cut surface in the case of cutting an aluminum plate with a plate thickness of 1 mm to 5 mm, by a $CO_2$ laser processing machine, a fiber laser processing machine, and a DDL laser processing machine.

FIG. 5 shows results for cutting an aluminum plate with a plate thickness of 1 mm to 5 mm, by a practical example using the laser processing machine of said embodiment, a comparative example 1 using the laser processing machine having the $CO_2$ laser, and a comparative example 2 using the laser processing machine having the fiber laser.

In this case, parameters for the laser beams and the optical elements in the laser processing machine of said embodiment were as follows.

TABLE 1

| Mild steel plate cutting method | Plate thickness (mm) | | | |
|---|---|---|---|---|
| Plate thickness (mm) | 1 | 1.6 | 3.2 | 4.5 |
| Focal length of condensing lens | 190 mm | 190 mm | 190 mm | 190 mm |
| Assist gas type | O2 | O2 | O2 | O2 |
| Assist gas pressure | 0.15 MPa | 0.08 MPa | 0.09 MPa | 0.07 MPa |
| Nozzle diameter | 0.8 mm | 0.8 mm | 0.8 mm | 1.4 mm |
| Nozzle height (gap) | 0.7 mm | 0.7 mm | 0.7 mm | 0.7 mm |
| Cutting speed | 8 m/min | 5.5 m/min | 3.8 m/min | 2.8 m/min |
| Beam waist | 364 μm | 364 μm | 364 μm | 364 μm |
| BBP | 10.3 | 10.3 | 10.3 | 10.3 |
| Rayleigh length | 3.4 mm | 3.4 mm | 3.4 mm | 3.4 mm |
| Output | 2 kW | 2 kW | 2 kW | 2 kW |
| Power density (kW/cm$^2$) | 1922.904 | 1922.904 | 1922.904 | 1922.904 |

TABLE 2

| Aluminum plate cutting method | Plate thickness (mm) | | | |
|---|---|---|---|---|
| Plate thickness (mm) | 1 | 2 | 3 | 4 |
| Focal length of condensing lens | 120 mm | 150 mm | 150 mm | 150 mm |
| Assist gas type | N2 | N2 | N2 | N2 |
| Assist gas pressure | 0.8 MPa | 1.2 MPa | 1.5 MPa | 1.2 MPa |
| Nozzle diameter | 2 mm | 2 mm | 2 mm | 4 mm |
| Nozzle height (gap) | 0.5 mm | 0.3 mm | 0.3 mm | 0.3 mm |
| Cutting speed | 14 m/min | 6 m/min | 4 m/min | 2.2 m/min |
| Beam waist | 230 μm | 300 μm | 300 μm | 300 μm |
| BBP | 10.3 | 10.3 | 10.3 | 10.3 |
| Rayleigh length | 1.3 mm | 2.2 mm | 2.2 mm | 2.2 mm |
| Output | 2 kW | 2 kW | 2 kW | 2 kW |
| Power density (kW/cm$^2$) | 4820.613 | 2830.856 | 2830.856 | 2830.856 |

Note that, in FIG. 5, a horizontal axis means a thickness of an aluminum plate, and a vertical axis indicates a surface roughness of a cut surface. Also, a solid line (▲ triangle mark) indicates a surface roughness of a cut surface cut by using the laser processing machine of said embodiment, a dotted line (♦ rhomboid mark) indicates a surface roughness of a cut surface cut by using the $CO_2$ laser processing machine, and a one dot chain line (■ rectangle mark) indicates a surface roughness of a cut surface cut by using the fiber laser processing machine.

As can be seen from FIG. 5, in the case of cutting the aluminum plate with a plate thickness of 1 mm to 5 mm by the laser processing machine of said embodiment, the surface roughness of the cut surface becomes Ra=1 μm to 2.5 μm.

In contrast to that, in the case of cutting that aluminum plate by the fiber laser processing machine, the surface roughness of the cut surface becomes greater than or equal to 2.5 μm. Also, with a plate thickness of greater than or equal to 3 mm, the surface roughness becomes greater than or equal to 3.0 μm.

Consequently, it is appreciated that the surface roughness of the cut surface with which said aluminum plate is cut by the laser processing machine of the embodiment becomes considerably smaller than the surface roughness of the cut surface cut by the fiber laser processing machine.

Note that, in the case of the cutting processing on said aluminum plate by the $CO_2$ laser processing machine, the surface roughness of its cut surface was about 1.5 μm to 2.5 μm.

Consequently, according to this exemplary test, it can be seen that, in the case of cutting said aluminum plate, the surface roughness Ra is considerably smaller for the cut surface by the laser processing machine according to the embodiment of the present invention than the cut surface by the fiber laser processing machine.

4. According to the above noted 2 and 3, if the laser processing machine of said embodiment is used in the case of the cutting processing of both the mild steel plate and the aluminum plate, it is possible to obtain the cut surface with the surface roughness that is very small even in the case of either sheet metal.

The invention claimed is:

1. A sheet metal processing method, comprising:
   oscillating laser beams of multiple wavelengths from a direct diode laser module;
   transmitting the oscillated laser beams of multiple wavelengths; and
   processing by cutting a sheet metal with a processing head that condenses the transmitted laser beams of multiple wavelengths and irradiates them onto the sheet metal that is a mild steel plate with a thickness greater than or equal to 3.2 mm and less than or equal to 5 mm, while using an assist gas that is oxygen with a pressure of 0.05 MPa to 0.2 MPa;
   said cutting creating a surface roughness Ra of a cut surface of the cut mild steel plate of less than or equal to 0.4 μm.

2. The sheet metal processing method of claim 1, wherein a focal length of a condensing lens mounted on said processing head is 150 mm to 250 mm.

3. The sheet metal processing method of claim 1, wherein in a case where a beam parameter product at an entrance of the processing head is 10.3 mm*mrad, a power of the laser beams from said processing head is 1600 W to 2000 W, a power density is $8.9 \times 10^5$ W/cm$^2$ to $2.8 \times 10^6$ W/cm$^2$, a beam waist diameter is 300 μm to 480 μm, and a Rayleigh length is 2.2 mm to 5.6 mm.

4. The sheet metal processing method of claim 1, wherein a nozzle diameter of a nozzle for ejecting an the assist gas is 0.8 mm to 4 mm, and a nozzle height is 0.5 mm to 1.5 mm.

5. A sheet metal processing method, comprising:
   oscillating laser beams of multiple wavelengths within a range of 910 nm to 950 nm from a direct diode laser module;
   transmitting the oscillated laser beams of multiple wavelengths; and
   processing by cutting a sheet metal with a processing head that condenses the transmitted laser beams of multiple wavelengths and irradiates them onto the sheet metal that is an aluminum plate with a thickness greater than or equal to 1 mm and less than or equal to 5 mm, while using an assist gas that is nitrogen with a pressure of greater than or equal to 0.8 MPa;
   said cutting creating a surface roughness Ra of a cut surface of the cut aluminum plate is less than or equal to 2.5 μm.

6. The sheet metal processing method of claim 5, wherein a focal length of a condensing lens mounted on said processing head is 120 mm to 190 mm.

7. The sheet metal processing method claim 5, wherein in a case where a beam parameter product at an entrance of the processing head is 10.3 mm*mrad, a power of the laser beams from said processing head is 1600 W to 2000 W, a power density is $1.5 \times 10^6$ W/cm$^2$ to $4.8 \times 10^6$ W/cm$^2$, a beam waist diameter is 230 μm to 364 μm, and a Rayleigh length is 1.3 mm to 3.4 mm.

8. The sheet metal processing method of claim 5, wherein a nozzle diameter of a nozzle for ejecting the assist gas is 1.5 mm to 4 mm, and a nozzle height is 0.3 mm to 1.0 mm.

9. A direct diode laser processing device, comprising:
a direct diode laser module for oscillating laser beams of multiple wavelengths;
a transmission fiber for transmitting the laser beams of multiple wavelengths oscillated by said direct diode laser module; and
a laser processing machine for processing by cutting a sheet metal with a processing head that condenses the laser beams of multiple wavelengths transmitted by said transmission fiber and irradiates them onto the sheet metal, said laser processing machine being configured to:
cut a mild steel plate with a thickness greater than or equal to 3.2 mm and less than or equal to 5 mm while using an assist gas that is oxygen with a pressure of 0.05 MPa to 0.2 MPa, a surface roughness Ra of a cut surface of the cut mild steel plate is less than or equal to 0.4 μm, and
cut an aluminum plate with a thickness greater than or equal to 1 mm and less than or equal to 5 mm while using an assist gas that is nitrogen with a pressure of greater than or equal to 0.8 MPa, a surface roughness Ra of a cut surface of the cut aluminum plate is less than or equal to 2.5 μm, wherein the direct diode laser module for oscillating laser beams of multiple wavelengths is within a range of 910 nm to 950 nm.

* * * * *

UNITED STATES PATENT AND TRADEMARK OFFICE
CERTIFICATE OF CORRECTION

PATENT NO. : 10,118,256 B2
APPLICATION NO. : 15/514079
DATED : November 6, 2018
INVENTOR(S) : A. Ishiguro et al.

Page 1 of 1

It is certified that error appears in the above-identified patent and that said Letters Patent is hereby corrected as shown below:

In the Claims

In Claim 4, Line 2 (Column 10, Line 41), please change "an the" to --an--.

Signed and Sealed this
Twenty-eighth Day of May, 2019

Andrei Iancu
*Director of the United States Patent and Trademark Office*